(12) United States Patent
Gu et al.

(10) Patent No.: US 11,974,491 B2
(45) Date of Patent: Apr. 30, 2024

(54) SUPPORT STRUCTURE, MANUFACTURING METHOD THEREOF, AND DISPLAY DEVICE

(71) Applicant: BOE Technology Group Co., Ltd., Beijing (CN)

(72) Inventors: Penghao Gu, Beijing (CN); Paoming Tsai, Beijing (CN); Song Zhang, Beijing (CN); Chunyan Xie, Beijing (CN); Jiahao Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 950 days.

(21) Appl. No.: 16/964,875

(22) PCT Filed: Feb. 17, 2020

(86) PCT No.: PCT/CN2020/075464
§ 371 (c)(1),
(2) Date: Jul. 24, 2020

(87) PCT Pub. No.: WO2020/177517
PCT Pub. Date: Sep. 10, 2020

(65) Prior Publication Data
US 2021/0217975 A1 Jul. 15, 2021

(30) Foreign Application Priority Data
Mar. 7, 2019 (CN) .......................... 201910173382.0

(51) Int. Cl.
*H01F 7/06* (2006.01)
*H10K 71/00* (2023.01)
*H10K 77/10* (2023.01)

(52) U.S. Cl.
CPC ........... *H10K 77/111* (2023.02); *H10K 71/00* (2023.02)

(58) Field of Classification Search
CPC ................ H10K 77/111; H10K 71/00; H10K 2102/351; G09F 9/30; Y02E 10/549
See application file for complete search history.

(56) References Cited

U.S. PATENT DOCUMENTS 9,977,466 B2 5/2018 Kwon et al.
10,424,749 B2 9/2019 Kim
(Continued)

FOREIGN PATENT DOCUMENTS

CN 101983538 A 3/2011
CN 206076240 U 4/2017
(Continued)

OTHER PUBLICATIONS

Guan, et al., "Research Progress of Paper Substrate in Flexible Display", Chinese Journal of Liquid Crystals and Displays, vol. 33, No. 5, May 2018.
(Continued)

*Primary Examiner* — Paul D Kim
(74) *Attorney, Agent, or Firm* — Banner & Witcoff, Ltd.

(57) ABSTRACT

A support structure, a manufacturing method thereof and a display device are provided. The support structure includes a metal substrate, and a buffer layer provided on the metal substrate; the support structure includes a bending region and a non-bending region; a portion of the metal substrate located in the bending region has a recess so that a thickness of the portion of the metal substrate located in the bending region is smaller than a thickness of a portion of the metal substrate located in the non-bending region; and the buffer layer is provided on a side of the metal substrate having the recess, and is at least located in the recess.

19 Claims, 5 Drawing Sheets

(56) References Cited

U.S. PATENT DOCUMENTS

| | | | |
|---|---|---|---|
| 2011/0043103 A1 | 2/2011 | Morishima | |
| 2015/0077952 A1 | 3/2015 | Kim | |
| 2018/0013079 A1* | 1/2018 | Cai | H10K 59/1213 |
| 2018/0123060 A1 | 5/2018 | Jang et al. | |
| 2019/0229282 A1* | 7/2019 | Zhang | H10K 71/00 |
| 2019/0333940 A1 | 10/2019 | Zeng et al. | |
| 2020/0061972 A1* | 2/2020 | Ha | B32B 37/06 |
| 2020/0273379 A1 | 8/2020 | Wang et al. | |
| 2020/0393721 A1 | 12/2020 | Xu et al. | |

FOREIGN PATENT DOCUMENTS

| | | | |
|---|---|---|---|
| CN | 107490892 A | 12/2017 | |
| CN | 107527556 A | 12/2017 | |
| CN | 207008995 U | 2/2018 | |
| CN | 107871451 A | 4/2018 | |
| CN | 107968109 A | 4/2018 | |
| CN | 108022944 A | 5/2018 | |
| CN | 207517287 U | 6/2018 | |
| CN | 108539060 A | 9/2018 | |
| CN | 108766247 A | 11/2018 | |
| CN | 108847137 A | 11/2018 | |
| CN | 208141720 U | 11/2018 | |
| CN | 108963076 A | 12/2018 | |
| CN | 108987434 A | 12/2018 | |
| CN | 109103345 A | 12/2018 | |
| CN | 208444535 U | 1/2019 | |
| CN | 109360498 A | 2/2019 | |
| CN | 109378330 A | 2/2019 | |
| CN | 208488923 U | 2/2019 | |
| CN | 209418505 U | 9/2019 | |
| IN | 109285459 A | 1/2019 | |
| IN | 208488919 U | 2/2019 | |
| KR | 20190003257 A | 1/2019 | |
| KR | 1020190001864 A | 1/2019 | |

OTHER PUBLICATIONS

Woo, et al., "Large-Area CVD-Grown MoS2 Driver Circuit Array for Flexible Organic Light-Emitting Diode Display", Advanced Science News, Advanced Electronic Materials, published on-line 2018.

Apr. 1, 2020—(CN) First Office Action Appn 201910173382.0 with English Translation.

Oct. 21, 2020—(CN) Second Office Action Appn 201910173382.0 with English Translation.

\* cited by examiner

SUPPORT STRUCTURE, MANUFACTURING METHOD THEREOF, AND DISPLAY DEVICE

This application is a U.S. National Phase Entry of International Application No. PCT/CN2020/075464 filed on Feb. 17, 2020, designating the United States of America and claiming priority to Chinese Patent Application No. 201910173382.0 filed on Mar. 7, 2019. The present application claims priority to and the benefit of the above-identified applications and the above-identified applications are incorporated by reference herein in their entirety.

TECHNICAL FIELD

Embodiments of the present disclosure relate to a support structure, a manufacturing method thereof and a display device.

BACKGROUND

Flexible display device has attracted more and more attention because of its deformable and bendable characteristics. For example, organic light-emitting diode (OLED) display device has gradually become the first choice for display due to its many advantages such as self-luminescence, high luminous efficiency, short response time, high definition, and high contrast.

The flexible display device comprises a flexible display panel and a support structure, the flexible display panel is protected and supported by the support structure attaching to the bottom of the flexible display panel, and the thickness of the support structure is relatively thick compared to the thickness of other single layer of the flexible display device. Therefore, the recovery performance after being bended, bending strength, deformability and the like of the support structure directly affect the overall bending performance of the flexible display device.

SUMMARY

At least one embodiment of the present disclosure provides a support structure, comprising a metal substrate, and a buffer layer provided on the metal substrate; the support structure comprises a bending region and a non-bending region, a portion of the metal substrate located in the bending region has a recess so that a thickness of the portion of the metal substrate located in the bending region is smaller than a thickness of a portion of the metal substrate located in the non-bending region; and the buffer layer is provided on a side of the metal substrate having the recess, and is at least located in the recess.

For example, a thickness of the metal substrate gradually increases in a direction from the bending region to the non-bending region.

For example, the portion of the metal substrate located in the non-bending region also has the recess, and a section of the recess has a stepped shape in a direction perpendicular to the metal substrate.

For example, a material of the metal substrate is at least one of stainless steel, copper alloy, and bismuth alloy.

For example, an elastic modulus of the metal substrate is about 100 Gpa~300 Gpa, and a tensile strength of the metal substrate is about 300 Mpa~600 Mpa.

For example, an elastic modulus of the buffer layer is about 2 Gpa~7 Gpa.

For example, a material of the buffer layer comprises a thermoplastic polymer material.

For example, the thermoplastic polymer material comprises at least one of thermoplastic polyimide, thermoplastic polyurethane, and polyethylene terephthalate.

For example, a thickness of the buffer layer is about 10 μm~30 μm.

For example, the metal substrate has a plurality of grooves on a side, away from the buffer layer, of the metal substrate, and the plurality of grooves do not penetrate through the metal substrate and are evenly distributed on the metal substrate.

For example, the metal substrate further has a positioning hole on the side, away from the buffer layer, of the metal substrate, and the positioning hole penetrates through the metal substrate.

For example, the support structure further comprises an adhesive layer provided on the buffer layer, and an adhesive force of the adhesive layer is about 500 gf/Inch~1500 gf/Inch.

For example, the adhesive layer is an acrylic pressure-sensitive adhesive layer.

For example, the thickness of the portion of the metal substrate located in the bending region is about 5 μm~25 μm, and the thickness of the portion of the metal substrate located in the non-bending region is about 25 μm~60 μm.

At least one embodiment of the present disclosure further provides a manufacturing method of a support structure, and the support structure comprises a bending region and a non-bending region. The manufacturing method comprises: providing a metal substrate; processing the metal substrate to form a recess in a portion of the metal substrate located in the bending region, wherein the recess causes that a thickness of the portion of the metal substrate located in the bending region is smaller than a thickness of a portion of the metal substrate located in the non-bending region; and forming a buffer layer on a side of the metal substrate having the recess, wherein the buffer layer is at least located in the recess.

For example, the processing the metal substrate to form the recess in the portion of the metal substrate located in the bending region comprises: performing an etching process on the metal substrate or performing a punching process using a mold on the metal substrate.

For example, the forming the buffer layer on the side of the metal substrate having the recess comprises: forming the buffer layer on the metal substrate by heat pressing, and an elastic modulus of the buffer layer is 2 Gpa~7 Gpa.

For example, the forming the buffer layer on the metal substrate by heat pressing comprises: performing the heat pressing for about 10 s~30 s under conditions that a temperature is about 300° C.~350° C. and a pressure is about 0.8N~1.0N.

At least one embodiment of the present disclosure further provides a display device, comprising the support structure as described above and a flexible display panel; and the flexible display panel is provided on the buffer layer.

For example, the flexible display panel is an OLED display panel.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first", "second", etc., which are used in the description and the claims of the present application for disclosure, are not intended to indicate any sequence, amount or importance, but distinguish various components. The terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On", "under", "right", "left" and the like are only used to indicate relative position relationship, and when the position of the object which is described is changed, the relative position relationship may be changed accordingly.

At present, a flexible display device has a certain bendable and foldable performance. However, as the duration of the flexible display device being bended becomes longer and the total number of times of the flexible display device being bended becomes more, the flexible display device may have many obvious creases. Furthermore, the modulus of a material of each layer in the flexible display device is relatively small, and after the flexible display device is bended, it is not easy for the flexible display device to return to the original state before the flexible display device is bended, that is, the flexible display device does not have a good recovery performance, so it is necessary to use external force or a material with good recovery performance to assist in the recovery of the bended flexible display device. If the flexible display device, which has been bended, is placed under a certain temperature and humidity condition, it is more difficult to return to the original state. Therefore, improving the recovery performance of each layer in the flexible display device becomes the focus of the development of the foldable display device; however, there are few materials that meet the requirements of flexible display and have a good resilience. The thickness of a support structure which is a component placed at the bottom of the display module is relatively large, and therefore, the resilience of the support structure itself is a key factor for the resilience of the display device.

The support structure included in the display device does not need to have a display function and an optical function, and a metal material with a good recovery performance may be used to form the support structure in the flexible display device. Generally, the metal material has a large elastic modulus, and a deformability of a metal layer is decreased as a thickness of the metal layer is increased. However, in the case where the thickness of the metal layer is small, for example, in the case where the thickness of the metal layer is 20 μm~40 μm, the metal layer has a good bending performance, and due to the large elastic modulus, the metal layer has a good recovery performance after the stress is relieved so as to return to the original state. Therefore, the metal material can be used as the material of the support structure.

Figure 1:
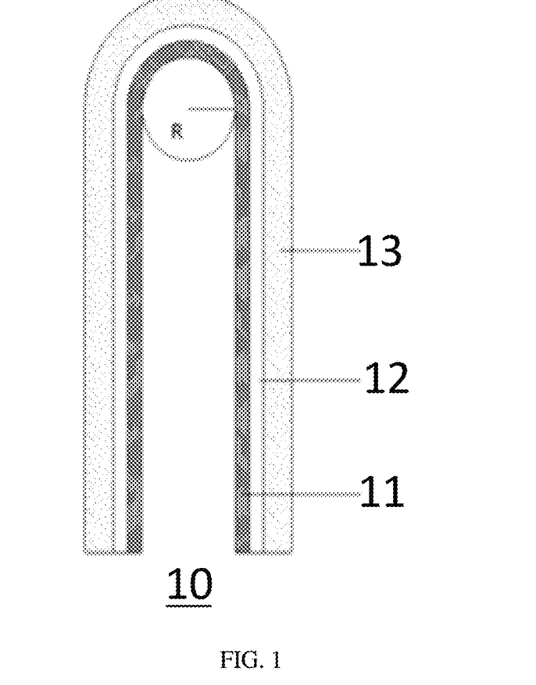
FIG. 1 is a schematic diagram of a sectional structure of a foldable display device, in which the foldable display device is folded.

For example, FIG. 1 is a schematic diagram of a sectional structure of a foldable display device, in which the foldable display device is folded. As illustrated in FIG. 1, an adhesive layer 12 is directly formed on a metal support 11 of the foldable display device 10, and a panel module 13 is directly formed on the adhesive layer 12.

Figure 2:
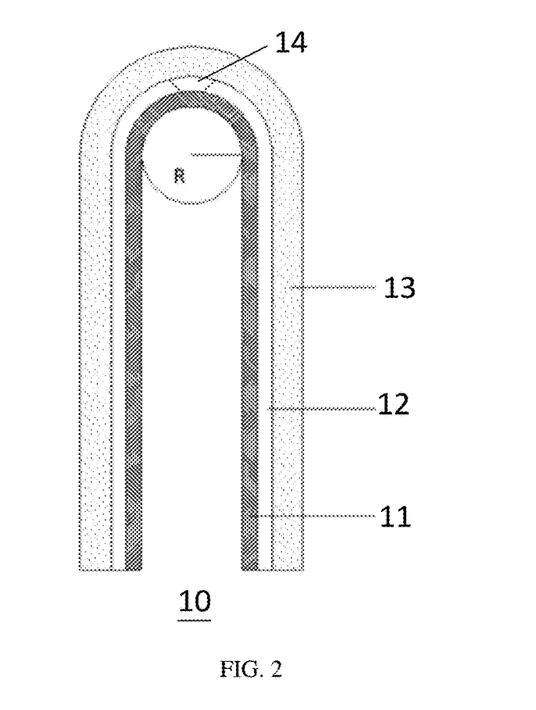
FIG. 2 is a schematic diagram of the section structure of the foldable display device in FIG. 1, in which an adhesive layer in the folded display device is broken.

For example, FIG. 2 is a schematic diagram of the section structure of the foldable display device in FIG. 1, in which the adhesive layer in the foldable display device is broken. As illustrated in FIG. 2, in a bending region 14, the adhesive layer 12 is broken, so that during a recovery process, the metal support 11 in the foldable display device is difficult to be pulled back by the adhesive layer, thereby as a result, the adhesive layer 12 is further torn from the metal support 11.

Figure 3:
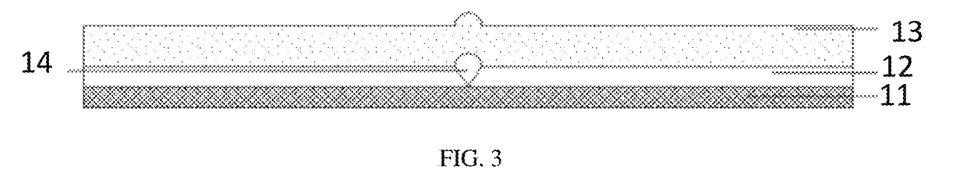
FIG. 3 is a schematic diagram of the section structure of the foldable display device in FIG. 2, in which the foldable display device is unfolded.

For example, FIG. 3 is a schematic diagram of the section structure of the foldable display device in FIG. 2, in which the flexible display device is recovered. As can be seen from FIG. 3, at the bending region 14 (for example, a middle region of the adhesive layer 12 in FIG. 3), the adhesive layer 12 is broken.

It can be seen from FIG. 1 to FIG. 3 that, the bonding strength between the metal support 11 and the adhesive layer 12 at the interface therebetween is insufficient. In the case where a thick adhesive layer is directly formed on the metal support 11, although the adhesive layer 12 is thick, the adhesive layer 12 may have a risk of breaking after a certain bending because the modulus of the metal layer is large and the stress is large, and in this case, it is difficult to find a suitable adhesive layer. Therefore, a regional design of the metal support 11 may be considered to achieve a better bending in the bending region without fatigue fracture, for example, the metal support 11 is designed to have a thinner thickness in the bending region and a larger thickness in a non-bending region.

Figure 4:
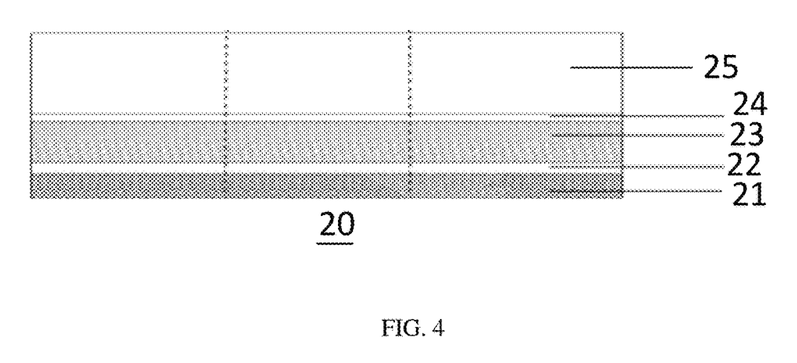
FIG. 4 is a schematic diagram of a sectional structure of another foldable display device.

At present, considering the problem that the adhesive layer 12 is easily broken, a position of an intermediate layer is changed by adding a new layer to reduce the risk of breaking of the adhesive layer 12. For example, FIG. 4 is a schematic diagram of a sectional structure of another foldable display device. As illustrated in FIG. 4, a first adhesive layer 22 is provided on the metal support 21, a substrate 23 formed of polyethylene terephthalate is provided on the first adhesive layer 22, a panel module 25 is provided on the substrate 23, and the panel module 25 is connected with the substrate 23 through a second adhesive layer 24.

It can be seen from FIG. 4 that, due to the addition of the second adhesive layer 24 and the substrate 23 formed of polyethylene terephthalate, the position of the intermediate layer of the entire foldable display device moves away from the first adhesive layer 22, thereby reducing the risk of breaking of the first adhesive layer 22; however, the intermediate layer becomes closer to the panel module, which increases the risk of breaking the various layers in the panel module 25, so that the problem that the foldable display device cannot work normally occurs. In addition, the thickness of the support structure in the foldable display device in FIG. 4 is significantly increased compared to the thickness of the support structure in FIG. 1 to FIG. 3, which is unfavorable for the design of the display device to be thin and light.

Considering the problems occurred in FIG. 1 to FIG. 4 above, the inventors of the present disclosure found that a larger thickness of the metal support is likely to cause fatigue fracture of the metal support, but a smaller thickness of the metal support is likely to cause the problems of poor support. Therefore, the regional design is adopted for the metal support to avoid the problem of fatigue fracture in the case that the metal support has the larger thickness and the problem of poor resilience and poor support in the case that the metal support has the smaller thickness, that is, by adopting different structures in different regions of the metal support, the foldable display device is more easily bended, and a good recovery performance after bending of the metal support is ensured, and in addition, it will not cause the layers on the metal support to break to cause the phenomenon that the display device cannot work normally.

The inventors of the present disclosure further find that the elastic modulus of the adhesive layer 12 in FIG. 1 and the elastic modulus of the first adhesive layer 22 in FIG. 4 are of Kpa level, and a material with a larger elastic modulus can be used to replace the adhesive layer 12 in FIG. 1 and the first adhesive layer 22 in FIG. 4; and in addition, the material with a larger elastic modulus should be ensured to be well bonded to the metal support. However, there are few materials with both of a high elastic modulus and a good adhesiveness, and therefore other processes have to be used so that the material with a high elastic modulus is bonded to the metal support.

For example, at least one embodiment of the present disclosure provides a support structure, the support structure includes a metal substrate, and a buffer layer provided on the metal substrate, the support structure includes a bending region and a non-bending region, a portion of the metal substrate located in the bending region has a recess so that a thickness of the portion of the metal substrate located in the bending region is smaller than a thickness of a portion of the metal substrate located in the non-bending region, and the buffer layer is provided on a side of the metal substrate having the recess, and is at least located in the recess.

Figure 5:
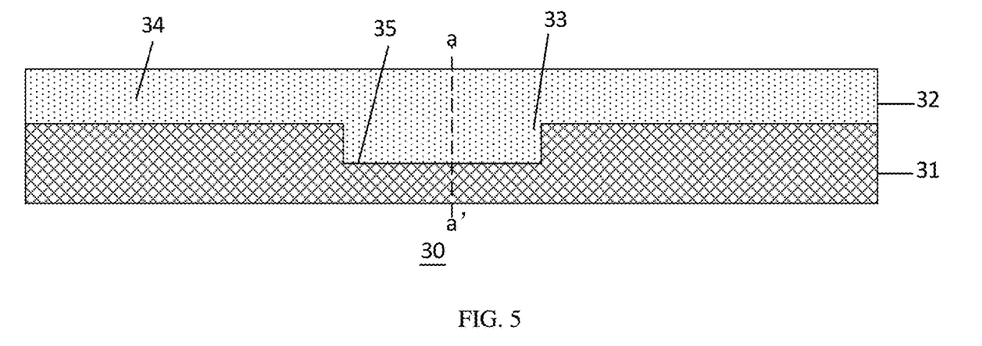
FIG. 5 is a schematic diagram of a sectional structure of a support structure provided by embodiments of the present disclosure.

For example, FIG. 5 is a schematic diagram of a sectional structure of the support structure provided by the embodiments of the present disclosure. As illustrated in FIG. 5, the support structure 30 includes a metal substrate 31 and a buffer layer 32 provided on the metal substrate 31. The support structure 30 includes a bending region 33 and a non-bending region 34. A portion of the metal substrate 31 located in the bending region 33 has a recess 35 so that a thickness of the portion of the metal substrate 31 located in the bending region 33 is smaller than a thickness of a portion of the metal substrate 31 located in the non-bending region 34, and the buffer layer 32 is provided on a side of the metal substrate 31 having the recess 35, and is at least located in the recess 35.

For example, the thickness of the portion of the metal substrate 31 located in the bending region 33 is smaller than the thickness of the portion of the metal substrate 31 located in the non-bending region 34. In this way, by designing different regions of the metal substrate 31 to have different thicknesses, the recovery performance of the metal substrate 31 is increased while ensuring that the metal substrate 31 has a certain elastic modulus.

For example, the buffer layer 32 is in direct contact with the metal substrate 31. The buffer layer 32 is formed on the side of the metal substrate 31 having the recess 35, and is at least located in the recess 35, so that the connection between the buffer layer 32 and the metal substrate 31 is tighter, thereby further ensuring that the buffer layer 32 does not peel off from the metal substrate 31 during a bending process.

For example, the recess 35 is symmetrical with respect to a center line a-a' of the metal substrate 31, and the bending region 33 is also symmetrical with respect to the center line a-a' of the metal substrate 31, which can facilitate the display device that is formed subsequently to be bended at the center line a-a' of the metal substrate 31.

It should be noted that, depending on the bending position of the formed display device, the recess 35 may be asymmetric with respect to the center line a-a' of the metal substrate 31, that is, the recess 35 may be formed at any position of the metal substrate. Correspondingly, the bending region 33 and the non-bending region 34 are arranged according to different bending positions of the display device, and each of them may be asymmetric with respect to the center line a-a' of the metal substrate 31, that is, each of the bending region 33 and the non-bending region 34 may be arranged at any position of the metal substrate 31, which are not detailed here for simplicity.

Figure 6:
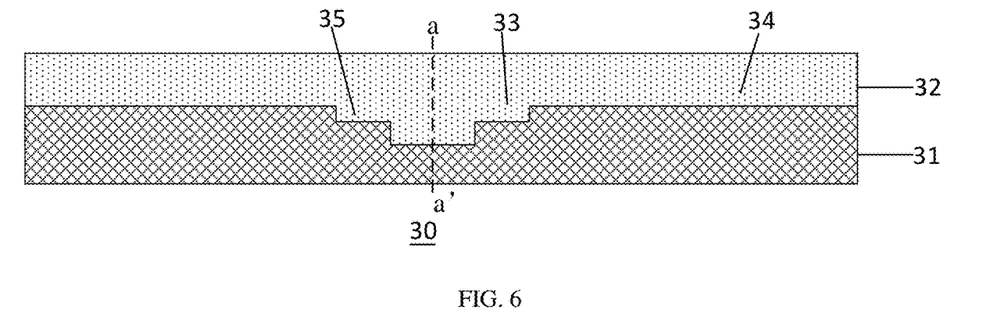
FIG. 6 is another schematic diagram of the sectional structure of the support structure provided by the embodiments of the present disclosure.

For example, FIG. 6 is another schematic diagram of the sectional structure of the support structure provided by the embodiments of the present disclosure. For example, in the support structure 30 illustrated in FIG. 6, the thickness of the metal substrate 30 gradually increases in the direction from the bending region 33 to the non-bending region 34.

For example, the total number of recesses formed in the bending region 33 may be one or more, and is not limited to the total number of the recesses 35 formed in the bending region 33 illustrated in FIG. 5 and FIG. 6, and for example, a plurality of recesses 35 with different depths are formed in the bending region 33. For example, the section of the recess 35 is not limited to the rectangle illustrated in FIG. 5 and FIG. 6, and the section of the recess 35 may have a smooth structure, for example, the section of the recess 35 is semicircular or fan-shaped.

For example, the thickness of the metal substrate 30 gradually increases in the direction from the bending region 33 to the non-bending region 34, to ensure that a change of a bending force on the surface of the metal substrate 30 becomes gentle. On the basis of ensuring that the metal substrate 31 has a certain elastic modulus and increasing the recovery performance of the metal substrate 31, the stress concentration is prevented so that the metal substrate 30 is less likely to be broken. In addition, the hardness requirements of the metal substrate 31 is also guaranteed.

Figure 7:
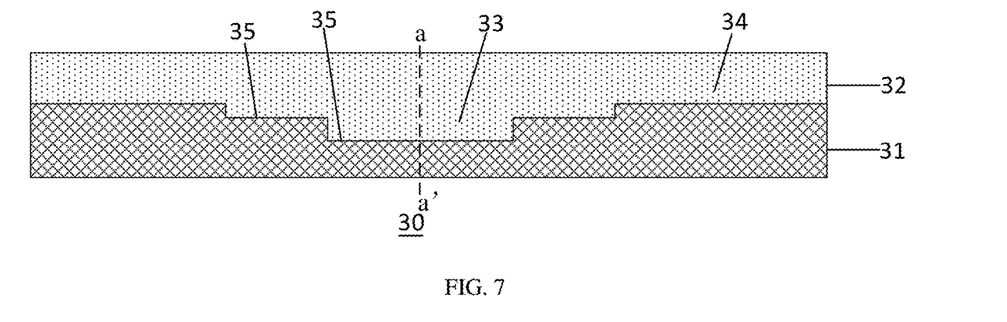
FIG. 7 is yet another schematic diagram of the sectional structure of the support structure provided by the embodiments of the present disclosure.

For example, FIG. 7 is yet another schematic diagram of the sectional structure of the support structure provided by the embodiments of the present disclosure. For example, in the support structure 30 illustrated in FIG. 7, the portion of the metal substrate 31 located in the non-bending region 34 also has the recess 35, so that the section of the recess 35 has a stepped shape in a direction perpendicular to the metal substrate 31.

Similarly, the total number of the recesses formed in the non-bending region 34 may be one or more. For example, the total number of the recesses 35 formed in the non-bending region 34 is not limited to that illustrated in FIG. 7, it is possible to form more recesses 35 with different depths in the non-bending region 34. For example, the section of the recess 35 is not limited to the rectangle illustrated in FIG. 7, and the section of the recess 35 may have a smooth structure, for example, the section of the recess 35 is semicircular or fan-shaped.

For example, the thickness of the portion of the metal substrate 31 located in the bending region 33 is about 5 μm~25 μm. For example, the thickness of the portion of the metal substrate 31 located in the bending region 33 is about 5 μm, 10 μm, 15 μm, 20 μm, or 25 μm.

For example, the thickness of the portion of the metal substrate 31 located in the non-bending region 34 is about 25 μm~60 μm. For example, the thickness of the portion of the metal substrate 31 located in the non-bending region 34 is about 25 μm, 30 μm, 35 μm, 40 μm, 45 μm, 50 μm, 55 μm, or 60 μm. In the case where the thickness of the metal substrate 31 is too large, it is difficult for the metal substrate 31 to be bended to have a certain bending radius; and in the case where the thickness of the metal substrate 31 is too small, the rigidity of the substrate cannot be satisfied.

For example, a material of the metal substrate 31 is at least one of stainless steel, copper alloy, and bismuth alloy.

For example, an elastic modulus of the metal substrate 31 is about 100 Gpa~300 Gpa.

For example, the elastic modulus of the metal substrate 31 is about 100 Gpa, 150 Gpa, 200 Gpa, 250 Gpa or 300 Gpa.

For example, a tensile strength of the metal substrate 31 is about 300 Mpa~600 Mpa.

For example, the tensile strength of the metal substrate 31 is about 300 Mpa, 350 Mpa, 400 Mpa, 450 Mpa, 500 Mpa, 550 Mpa or 600 Mpa.

For example, the elastic modulus represents the ability of an object to resist elastic deformation. The greater the value is, the greater the stress that causes the object to elastically deform is, that is, the greater the rigidity of the object is, that is, the smaller the elastic deformation under a given stress is.

For the metal material, the tensile strength is the threshold value of the transition of the metal material from uniform plastic deformation to locally concentrated plastic deformation, and is also the maximum load capacity of the metal material under static tensile conditions. The tensile strength is the force corresponding to the maximum uniform plastic deformation of the material. Before the specimen is subjected to the maximum tensile stress, the deformation of the specimen is uniform; after the maximum tensile stress is exceeded, the specimen begins to shrink, that is, concentrated deformation occurs. For a brittle material without uniform plastic deformation or with small uniform plastic deformation, the tensile strength represents the fracture resistance of the material.

In addition, the greater the tensile strength is, the smaller the elongation at break is. The elongation at break refers to the ratio of the length of the specimen at the time of breaking to the original length, which is an indicator of toughness. The smaller the elongation at break is, the better the toughness of the material is, and the material is less likely to break when the bending radius is small, which makes the greater the maximum stress that the material can withstand when it breaks under bending load or reaches a specified deflection, that is, the bending strength is greater.

For example, an elastic modulus of the buffer layer 32 is about 2 Gpa~7 Gpa.

For example, the elastic modulus of the buffer layer 32 is about 2 Gpa, 3 Gpa, 4 Gpa, 5 Gpa, 6 Gpa or 7 Gpa.

For example, compared to the adhesive layer 12 in FIG. 1 and the first adhesive layer 22 in FIG. 4 each of which has an adhesiveness and has the elastic modulus of Kpa level, the elastic modulus of the buffer layer is of Gpa level, which is much greater than the elastic modulus of the adhesive layer 12 in FIG. 1 and the elastic modulus of the first adhesive layer 22 in FIG. 4; and in addition, the buffer layer 32 is made to be very thin. On the one hand, the bending and recovery performance of the display device that is formed subsequently is improved; on the other hand, the thickness of the entire display device is reduced, which is beneficial to the thin and light design of the display device.

For example, a material of the buffer layer 32 includes a thermoplastic polymer material. For example, the thermoplastic polymer material is formed on the metal substrate 31 by heat pressing, and the thickness of the buffer layer 32 is thin, and the adhesion of the buffer layer 32 on the metal substrate 31 is good.

For example, the thermoplastic polymer material includes at least one of thermoplastic polyimide, thermoplastic polyurethane, and polyethylene terephthalate.

For example, the thermoplastic polyimide refers to a type of polymer containing an imide ring (—CO—NH—CO—) in the main chain.

For example, the thermoplastic polyurethane is a polymer containing urethane groups in the main chain of the macromolecule.

For example, polyethylene terephthalate (PET) is the most important type of thermoplastic polyester, commonly known as polyester resin. The polyethylene terephthalate is manufactured by transesterification of dimethyl terephthalate with ethylene glycol, or by esterification of terephthalic acid with ethylene glycol to synthesize dihydroxyethyl phthalate, and then polycondensation.

For example, the above-mentioned thermoplastic polymer material has the characteristics of high strength, good toughness, small friction coefficient, and high stability, so as to avoid the buffer layer 32 formed of the thermoplastic polymer material from scratching other layers, or scratching the display screen, etc.

For example, during the display module is formed later, an adhesive layer is formed between the display module and the buffer layer 32. The buffer layer 32 and the adhesive layer have a good adhesion therebetween, which improves the connection strength between the display module and the metal substrate 31.

For example, a thickness of the buffer layer 32 is about 10 μm~30 μm.

For example, the thickness of the buffer layer 32 is about 10 μm, 15 μm, 20 μm, 25 μm or 30 μm.

Figure 8:
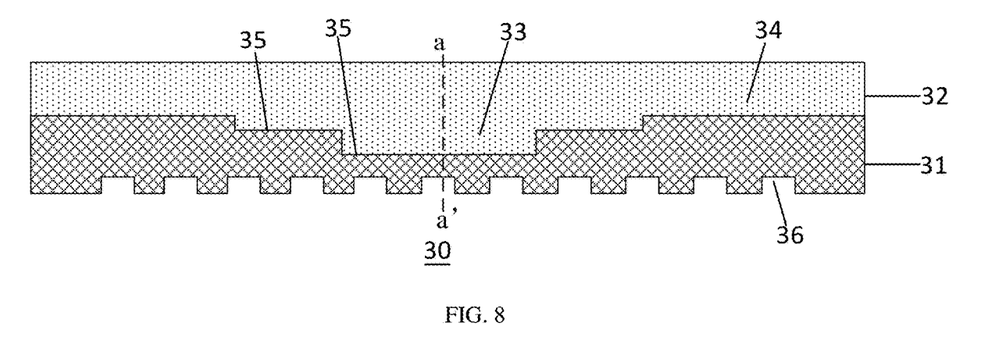
FIG. 8 is yet another schematic diagram of the sectional structure of the support structure provided by the embodiments of the present disclosure.

For example, FIG. 8 is yet another schematic diagram of the sectional structure of the support structure provided by the embodiments of the present disclosure. As illustrated in FIG. 8, the metal substrate 31 has a plurality of grooves 36 on a side, away from the buffer layer 32, of the metal substrate 31, and the plurality of grooves 36 do not penetrate through the metal substrate 31 and are evenly distributed on the metal substrate 31.

It should be noted that, according to actual requirements, the plurality of grooves 36 may be unevenly distributed on the metal substrate 31.

For example, the grooves 36 increase the contact area between the metal substrate 31 and the air, thereby improving the heat dissipation performance of the metal substrate 31, and timely guiding the heat generated in the display device to the air. Furthermore, none of the plurality of grooves 36 penetrates through the metal substrate 31, which ensures the hardness requirement of the metal substrate 31.

Figure 9:
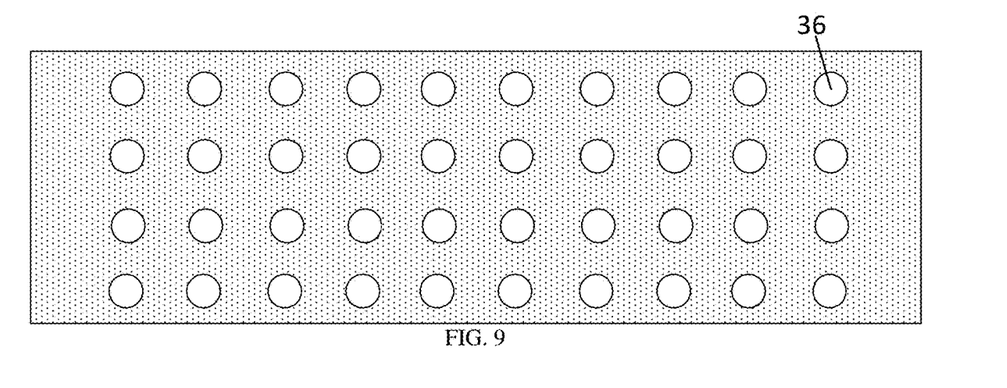
FIG. 9 is a schematic bottom planar diagram of the support structure illustrated in FIG. 8.

For example, FIG. 9 is a schematic bottom planar diagram of the support structure illustrated in FIG. 8. As can be seen from FIG. 9, the grooves 36 are evenly distributed on the surface of the metal substrate 31. Each of the grooves 36 does not penetrate through the metal substrate 31 in a direction parallel to a main surface of the metal substrate 31, and does not penetrate through the metal substrate 31 in a direction perpendicular to the main surface of the metal substrate 31, that is, the metal substrate 31 is continuous along the long side direction and the short side direction on the plane parallel to the main surface thereof.

For example, as can be seen from FIG. 9, in the direction parallel to the main surface of the metal substrate 31, the sectional shape of the groove 36 is circular, and the corresponding three-dimensional shape of the groove 36 is cylindrical. The embodiments of the present disclosure have no particular limitation on the shape of the groove 36 as long as the metal substrate is not penetrated as described above.

Figure 10:
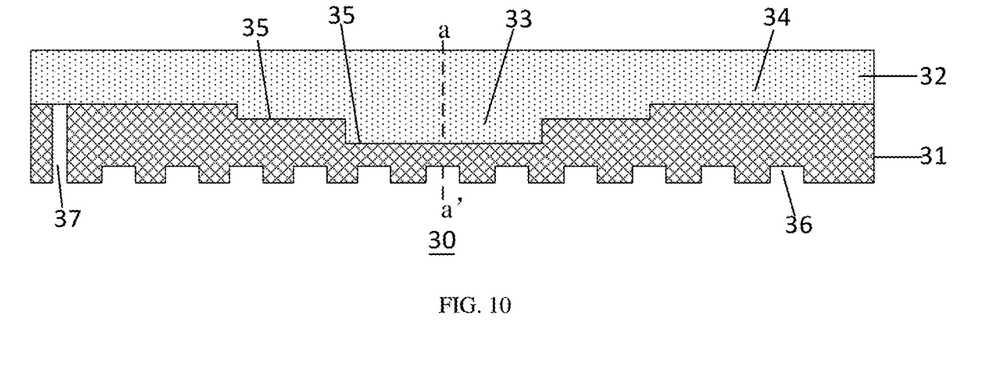
FIG. 10 is yet another schematic diagram of the sectional structure of the support structure provided by the embodiments of the present disclosure.

For example, FIG. 10 is yet another schematic diagram of the sectional structure of the support structure provided by the embodiments of the present disclosure. As illustrated in FIG. 10, the metal substrate 31 further has a positioning hole 37 on the side, away from the buffer layer 32, of the metal substrate, and the positioning hole 37 penetrates through the metal substrate 31. The positioning hole 37 for example is used as a mark to facilitate alignment between the support structure and a layer that is formed subsequently.

Figure 11:
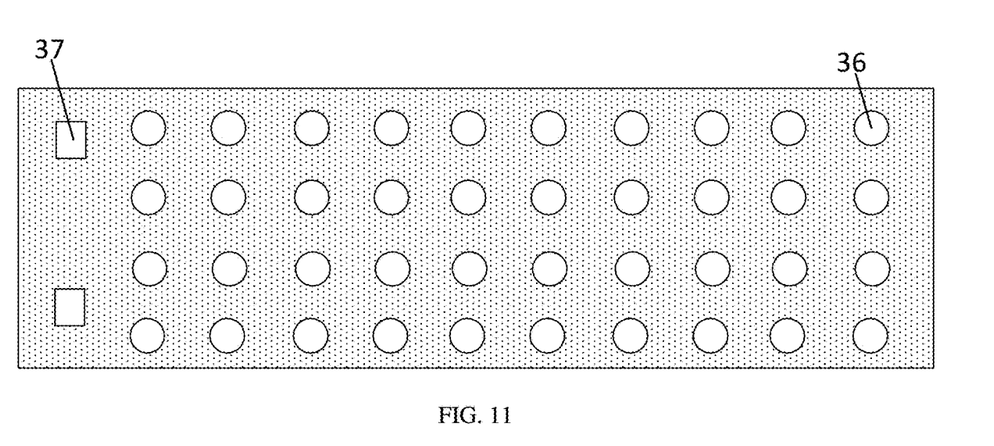
FIG. 11 is a schematic bottom planar diagram of the support structure illustrated in FIG. 10.

FIG. 11 is a schematic bottom planar diagram of the support structure illustrated in FIG. 10. As illustrated in FIG. 11, two positioning holes 37 are provided on the leftmost side of the metal substrate 31. The total number of the positioning holes 37 is not limited, and more positioning holes 37 may be provided on the metal substrate 31 to make positioning more accurate, which is not limited here.

Figure 12:
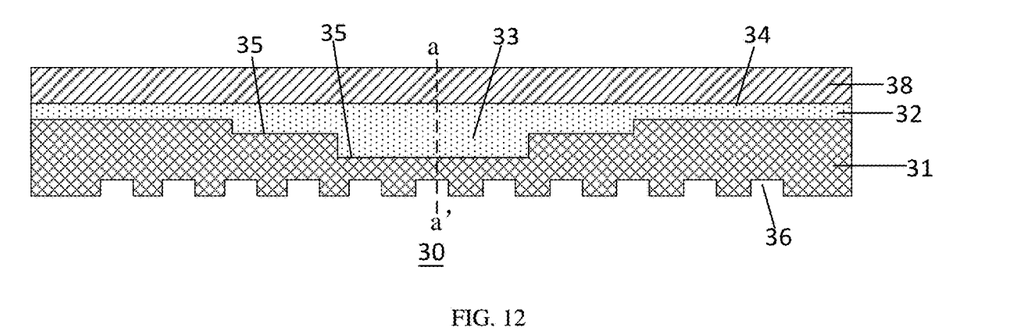
FIG. 12 is yet another schematic diagram of the sectional structure of the support structure provided by the embodiments of the present disclosure.

For example, FIG. 12 is yet another schematic diagram of the sectional structure of the support structure provided by the embodiments of the present disclosure. As illustrated in FIG. 12, the support structure 30 further includes an adhesive layer 38 provided on the buffer layer 32. A adhesive force of the adhesive layer 38 is about 500 gf/Inch~1500 gf/Inch.

For example, the adhesive force of the adhesive layer 38 is about 500 gf/Inch, 1000 gf/Inch or 1500 gf/Inch.

For example, the adhesive layer 38 is an acrylic pressure-sensitive adhesive layer. The pressure-sensitive adhesive layer is a type of adhesive layer that is sensitive to pressure. The curing temperature of the pressure-sensitive adhesive layer is low, and the viscosity is good.

For example, the surface of the adhesive layer 38 is provided with a release film. By attaching the release film, the adhesive layer 38 is protected. Once the adhesive layer 38 needs to be used, the release film is peeled off to expose the adhesive layer 38.

Figure 13:
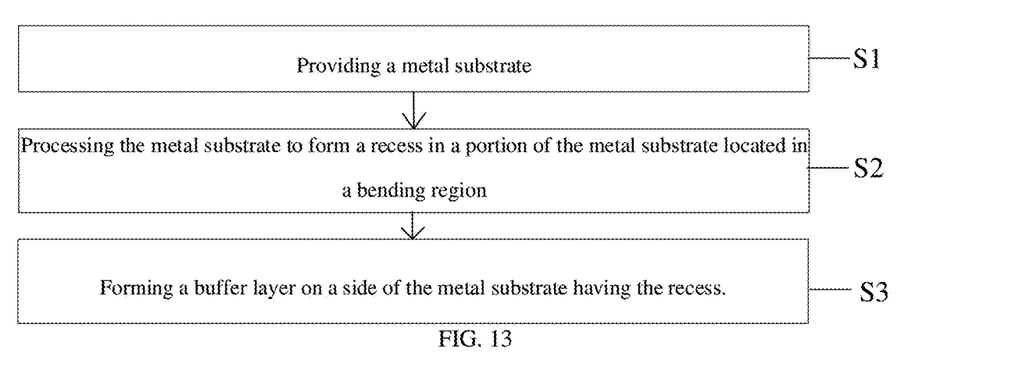
FIG. 13 is a flowchart of a manufacturing method of a support structure provided by the embodiments of the present disclosure.

At least one embodiment of the present disclosure further provides a manufacturing method of a support structure. FIG. 13 is a flowchart of the manufacturing method of the support structure provided by the embodiments of the present disclosure, the support structure includes a bending region and a non-bending region. As illustrated in FIG. 13, the manufacturing method includes the following steps.

S1: providing a metal substrate.

For example, a material of the metal substrate is at least one of stainless steel, copper alloy, and bismuth alloy.

For example, an elastic modulus of the metal substrate is about 100 Gpa~300 Gpa.

For example, the elastic modulus of the metal substrate is about 100 Gpa, 150 Gpa, 200 Gpa, 250 Gpa or 300 Gpa.

For example, a tensile strength of the metal substrate is about 300 Mpa~600 Mpa.

For example, the tensile strength of the metal substrate is about 300 Mpa, 350 Mpa, 400 Mpa, 450 Mpa, 500 Mpa, 550 Mpa or 600 Mpa.

S2: processing the metal substrate to form a recess in a portion of the metal substrate located in the bending region.

For example, a thickness of the portion of the metal substrate in the bending region is about 5 μm~25 μm.

For example, the thickness of the portion of the metal substrate in the bending region is about 5 μm, 10 μm, 15 μm, 20 μm, or 25 μm.

For example, a thickness of the portion of the metal substrate located in the non-bending region is about 25 μm~60 μm.

For example, the thickness of the portion of the metal substrate 31 located in the non-bending region 34 is about 25 μm, 30 μm, 35 μm, 40 μm, 45 μm, 50 μm, 55 μm, or 60 μm.

For example, in the case where the thickness of the metal substrate is too large, it is difficult for the metal substrate to bend to have a certain bending radius; and in the case where the thickness of the metal substrate is too small, the rigidity of the substrate cannot be satisfied.

For example, the recess causes that the thickness of the portion of the metal substrate located in the bending region is smaller than the thickness of the portion of the metal substrate located in the non-bending region.

For example, the processing the metal substrate to form the recess in the portion of the metal substrate located in the bending region includes: performing an etching process on the metal substrate or preforming a punching process using a mold on the metal substrate.

For example, an etching solution that is used in the etching process includes: acidic copper chloride, alkaline copper chloride, ferric chloride, ammonium persulfate, a mixture of sulfuric acid and chromic acid, a mixture of sulfuric acid and hydrogen peroxide, and the like.

For example, in the punching process using the mold, wear resistance is an important factor that determines the life of the mold, and commonly used steels of mold include carbon steel and/or alloy steel.

S3: forming a buffer layer on a side of the metal substrate having the recess.

For example, the buffer layer is at least located in the recess, so that the connection between the buffer layer and the metal substrate is tighter, thereby ensuring that the buffer layer does not peel off from the metal substrate during the bending process.

For example, the forming the buffer layer on the side of the metal substrate having the recess includes: forming the buffer layer on the metal substrate by heat pressing, and an elastic modulus of the buffer layer is 2 Gpa~7 Gpa.

For example, the elastic modulus of the buffer layer 32 is about 2 Gpa, 3 Gpa, 4 Gpa, 5 Gpa, 6 Gpa or 7 Gpa.

For example, the elastic modulus of the buffer layer is Gpa level, and the buffer layer 32 is made to be very thin. On the one hand, the folding and recovery performance of the display device that is formed subsequently is improved; on the other hand, the thickness of the entire display device is reduced, which is beneficial to the thin and light design of the display device.

For example, a material of the buffer layer includes a thermoplastic polymer material. For example, the thermoplastic polymer material is formed on the metal substrate by heat pressing, and the thickness of the buffer layer is thin, and the adhesion of the buffer layer on the metal substrate is good.

For example, the thermoplastic polymer material includes at least one of thermoplastic polyimide, thermoplastic polyurethane, and polyethylene terephthalate.

For example, thermoplastic polyimide refers to a type of polymer containing an imide ring (—CO—NH—CO—) in the main chain.

For example, thermoplastic polyurethane is a polymer containing urethane groups in the main chain of the macromolecule.

For example, polyethylene terephthalate (PET) is the most important type of thermoplastic polyester, commonly known as polyester resin. The polyethylene terephthalate is manufactured by transesterification of dimethyl terephthalate with ethylene glycol, or by esterification of terephthalic acid with ethylene glycol to synthesize dihydroxyethyl phthalate, and then polycondensation.

For example, the above-mentioned thermoplastic polymer material has the characteristics of high strength, good toughness, small friction coefficient, and high stability. It can avoid the buffer layer 32 formed of the thermoplastic polymer material from scratching other layers, or scratching the display screen, etc.

For example, the forming the buffer layer on the metal substrate by heat pressing includes: performing the heat pressing for about 10 s~30 s under the conditions that a temperature is about 300° C.~350° C. and a pressure is about 0.8N~1.0N.

For example, the forming the buffer layer on the metal substrate by heat pressing includes: performing the heat pressing for about 20 s under the conditions that the temperature is about 320° C. and the pressure is about 0.9N.

The above method for manufacturing the support structure not only has less process steps, but also has lower cost.

For example, a groove is further formed on a side, away from the buffer layer, of the metal substrate. For example, a plurality of grooves are formed, and each of the grooves do not penetrate through the metal substrate and the grooves are evenly distributed on the metal substrate. As needed, the grooves may be unevenly distributed on the metal substrate.

For example, the grooves increase the contact area between the metal substrate and the air, thereby improving the heat dissipation of the metal substrate, and timely guiding the heat generated in the display device to the air. Furthermore, none of the grooves penetrates through the metal substrate, which ensures the hardness requirement of the metal substrate.

For example, a positioning hole is further formed on the side, away from the buffer layer, of the metal substrate, the positioning hole penetrates through the metal substrate, and the positioning hole is used as a mark to facilitate alignment between a layer that is formed subsequently and the support structure.

Figure 14:
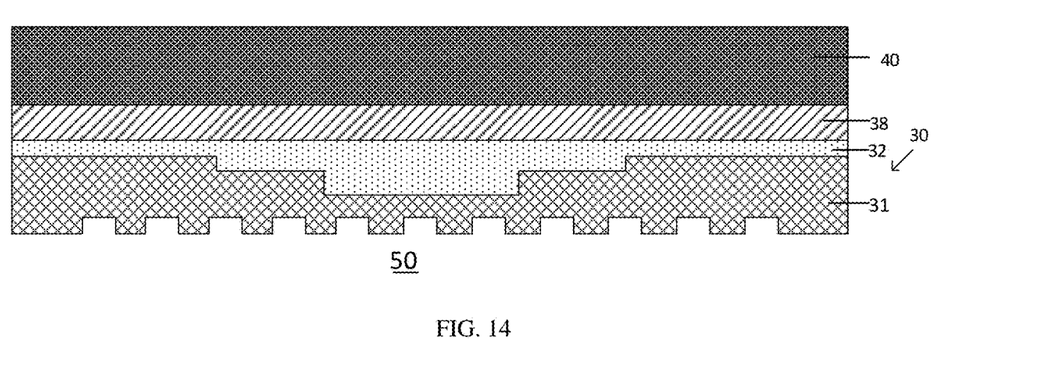
FIG. 14 is a schematic diagram of a sectional structure of a display device provided by the embodiments of the present disclosure.

At least one embodiment of the present disclosure further provides a display device. FIG. 14 is a schematic diagram of a sectional structure of the display device provided by the embodiments of the present disclosure. As illustrated in FIG. 14, the display device 50 includes the support structure 30 provided by any one of the foregoing embodiments, and a flexible display panel 40. The flexible display panel 40 is provided on the buffer layer 32, and the flexible display panel 40 is provided on the buffer layer 32 by attaching the flexible display panel 40 to the buffer layer 32 through the adhesive layer 38.

For example, the flexible display panel is an organic light-emitting diode (OLED) display panel. The OLED element includes an anode, a hole transport material, a hole injection layer, a light-emitting layer, an electron transport layer, an electron injection layer, and a cathode, which are provided in this order. As needed, the OLED element may further include an inorganic insulating layer, an organic insulating layer, a cover plate, and the like provided on the cathode.

For example, the structure of the organic light-emitting diode (OLED) may be referred to its conventional structure and is not detailed here for simplicity.

The support structure, the manufacturing method thereof and the display device provided by the embodiments of the present disclosure have at least one of the following beneficial effects:

(1) The support structure provided by at least one embodiment of the present disclosure adopts the regional design for the metal support, so that the thickness of the portion of the metal substrate in the bending region is smaller than the thickness of the portion of the metal substrate in the non-bending region, thereby avoiding the problem of fatigue fracture caused by a large thickness of the metal support, and avoiding the problems of poor resilience and poor support effect caused by a small thickness of the metal support.

(2) The support structure provided by at least one embodiment of the present disclosure forms the buffer layer with high elastic modulus on the metal substrate, ensures that the buffer layer with high elastic modulus is well bonded to the metal support without using an adhesive layer, and reduces the thickness of the final display device so that the display device is lighter and thinner.

The following statements should be noted:

(1) The accompanying drawings involve only the structure(s) in connection with the embodiment(s) of the present disclosure, and other structure(s) can be referred to common design(s).

(2) For the sake of clarity, in the accompanying drawings used to describe the embodiments of the present disclosure, the thickness of layers or regions is enlarged or reduced, that is, these accompanying drawings are not drawn according to actual scale. It is understood that, in the case where an element such as a layer, a film, a region, or a substrate is referred to as being "on" or "under" another element, the element can be "directly" located "on" or "under" the another element, or there may be an intermediate element.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A support structure, comprising a metal substrate, and a buffer layer provided on the metal substrate, wherein
   the support structure comprises a bending region and a non-bending region, a portion of the metal substrate located in the bending region has a first recess so that a thickness of the portion of the metal substrate located in the bending region having the first recess is smaller than a thickness of a portion of the metal substrate located in the non-bending region;
   the portion of the metal substrate located in the non-bending region has a second recess, and a section of the second recess has a stepped shape in a direction perpendicular to the metal substrate; and
   the buffer layer is provided on a side of the metal substrate having the first recess and the second recess, and is at least located in the first recess and the second recess.

2. The support structure according to claim 1, wherein a thickness of the metal substrate gradually increases in a direction from the bending region to the non-bending region.

3. The support structure according to claim 1, wherein a material of the metal substrate is at least one of stainless steel, copper alloy, and bismuth alloy.

4. The support structure according to claim 3, wherein an elastic modulus of the metal substrate is about 100 Gpa~300 Gpa, and a tensile strength of the metal substrate is about 300 Mpa~600 Mpa.

5. The support structure according to claim 1, wherein an elastic modulus of the buffer layer is about 2 Gpa~7 Gpa.

6. The support structure according to claim 5, wherein a material of the buffer layer comprises a thermoplastic polymer material.

7. The support structure according to claim 6, wherein the thermoplastic polymer material comprises at least one of thermoplastic polyimide, thermoplastic polyurethane, and polyethylene terephthalate.

8. The support structure according to claim 6, wherein a thickness of the buffer layer is about 10 μm~30 μm.

9. The support structure according to claim 1, wherein the metal substrate has a plurality of grooves on a side, away from the buffer layer, of the metal substrate, and the plurality of grooves do not penetrate through the metal substrate and are evenly distributed on the metal substrate.

10. The support structure according to claim 9, wherein the metal substrate further has a positioning hole, and the positioning hole penetrates through the metal substrate.

11. The support structure according to claim 1, further comprising an adhesive layer provided on the buffer layer, and an adhesive force of the adhesive layer is about 500 gf/Inch~1500 gf/Inch.

12. The support structure according to claim 11, wherein the adhesive layer is an acrylic pressure-sensitive adhesive layer.

13. The support structure according to claim 1, wherein the thickness of the portion of the metal substrate located in the bending region is about 5 μm~25 μm, and the thickness of the portion of the metal substrate located in the non-bending region is about 25 μm~60 μm.

14. A manufacturing method of a support structure, wherein the support structure comprises a bending region and a non-bending region, and the manufacturing method comprises:
   providing a metal substrate;
   processing the metal substrate to form a first recess in a portion of the metal substrate located in the bending region, wherein the first recess causes that a thickness of the portion of the metal substrate located in the bending region is smaller than a thickness of a portion of the metal substrate located in the non-bending region;
   processing the portion of the metal substrate located in the non-bending region to form a second recess, wherein a section of the second recess has a stepped shape in a direction perpendicular to the metal substrate; and
   forming a buffer layer on a side of the metal substrate having the first recess and the second recess, wherein the buffer layer is at least located in the first recess and the second recess.

15. The manufacturing method according to claim 14, wherein the processing the metal substrate to form the first recess in the portion of the metal substrate located in the bending region comprises: performing an etching process on the metal substrate or performing a punching process using a mold on the metal substrate.

16. The manufacturing method according to claim 14, wherein the forming the buffer layer on the side of the metal substrate having the first recess comprises: forming the buffer layer on the metal substrate by heat pressing, and an elastic modulus of the buffer layer is 2 Gpa~7 Gpa.

17. The manufacturing method according to claim 16, wherein the forming the buffer layer on the metal substrate by heat pressing comprises: performing the heat pressing for about 10 s~30 s under conditions that a temperature is about 300° C.~350° C. and a pressure is about 0.8N~1.0N.

18. A display device, comprising a support structure and a flexible display panel, wherein the support structure comprises:
   a metal substrate, and a buffer layer provided on the metal substrate, wherein the support structure comprises a bending region and a non-bending region, a portion of the metal substrate located in the bending region has a first recess so that a thickness of the portion of the metal substrate located in the bending region having the first recess is smaller than a thickness of a portion of the metal substrate located in the non-bending region;
   the portion of the metal substrate located in the non-bending region has a second recess, wherein a section of the second recess has a stepped shape in a direction perpendicular to the metal substrate;

the buffer layer is provided on a side of the metal substrate having the first recess and the second recess, and is at least located in the first recess and the second recess; and wherein the flexible display panel is provided on the buffer layer.

19. The display device of claim 18, wherein the flexible display panel is an OLED display panel.

* * * * *